US011206060B2

(12) United States Patent
Fornage

(10) Patent No.: US 11,206,060 B2
(45) Date of Patent: Dec. 21, 2021

(54) APPARATUS FOR COMMUNICATING ACROSS AN ISOLATION BARRIER

(71) Applicant: Enphase Energy, Inc., Petaluma, CA (US)

(72) Inventor: Martin Fornage, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 392 days.

(21) Appl. No.: 16/138,424

(22) Filed: Sep. 21, 2018

(65) Prior Publication Data

US 2019/0089412 A1    Mar. 21, 2019

Related U.S. Application Data

(60) Provisional application No. 62/561,450, filed on Sep. 21, 2017.

(51) Int. Cl.
| | |
|---|---|
| *H04B 5/00* | (2006.01) |
| *H04L 25/02* | (2006.01) |
| *H01F 27/42* | (2006.01) |
| *H03B 7/14* | (2006.01) |
| *H05K 1/18* | (2006.01) |
| *H02M 1/08* | (2006.01) |
| *H02M 7/53846* | (2007.01) |
| *H01F 19/00* | (2006.01) |
| *H01F 27/28* | (2006.01) |
| *H05K 1/02* | (2006.01) |

(Continued)

(52) U.S. Cl.
CPC ............. *H04B 5/005* (2013.01); *H01F 19/00* (2013.01); *H01F 27/2804* (2013.01); *H01F 27/425* (2013.01); *H02M 1/08* (2013.01); *H02M 7/53846* (2013.01); *H03B 5/1278* (2013.01); *H03B 7/14* (2013.01); *H04L 25/0268* (2013.01); *H04L 25/0272* (2013.01); *H05K 1/0239* (2013.01); *H05K 1/18* (2013.01); *H01F 2019/085* (2013.01); *H01F 2027/2809* (2013.01); *H02M 1/0003* (2021.05); *H05K 1/165* (2013.01); *H05K 2201/09672* (2013.01); *H05K 2201/1003* (2013.01)

(58) Field of Classification Search
CPC .. H02M 3/3382; H02M 1/08; H02M 7/53846; H02M 2001/0003; H04B 5/005; H03B 7/14; H04L 25/0268; H05K 1/18; H05K 2201/1003; H01F 27/425
See application file for complete search history.

(56) References Cited

U.S. PATENT DOCUMENTS 2,979,669 A * 4/1961 Zwanenburg ............ H03B 5/10
                                                       331/169
4,158,752 A * 6/1979 Stewart ................. H04M 19/08
                                                       455/401

(Continued)

*Primary Examiner* — Kyle J Moody
(74) *Attorney, Agent, or Firm* — Moser Taboada

(57) ABSTRACT

Apparatus for communicating across an isolation barrier. In one embodiment, the apparatus comprises a transformer having a first winding disposed on a first side of a printed circuit board (PCB) and coupled to a first local ground, and a second winding disposed on a second side of the PCB, the second side opposite to the first side, and coupled to a second local ground; a transmitter coupled to the first winding; and a receiver, coupled the second winding, that generates an output signal based on a signal received from the transmitter.

18 Claims, 6 Drawing Sheets

(51) Int. Cl.
  *H03B 5/12* (2006.01)
  *H05K 1/16* (2006.01)
  *H01F 19/08* (2006.01)
  *H02M 1/00* (2006.01)

(56) References Cited

U.S. PATENT DOCUMENTS

| | | | |
|---|---|---|---|
| 5,109,326 A * | 4/1992 | Martin, Jr. | H02M 3/33584 323/266 |
| 5,422,605 A * | 6/1995 | Yang | H03B 5/36 331/114 |
| 5,998,979 A * | 12/1999 | Nilsson | G05F 1/565 323/273 |
| 6,549,436 B1 * | 4/2003 | Sun | H02M 3/337 363/44 |
| 6,603,383 B2 * | 8/2003 | Gevorgian | H01F 17/0013 333/25 |
| 7,113,750 B2 * | 9/2006 | Eastwood | H04B 5/005 324/76.11 |
| 7,772,933 B1 * | 8/2010 | Nicholls | H03B 5/1231 331/117 FE |
| 8,693,528 B1 * | 4/2014 | Shrestha | H04L 25/0276 375/219 |
| 9,419,470 B2 * | 8/2016 | Von Novak, III | H02J 7/025 |
| 9,948,141 B2 * | 4/2018 | Hosotani | H02J 50/12 |
| 10,224,750 B2 * | 3/2019 | Hosotani | H01F 5/00 |
| 2003/0142513 A1 * | 7/2003 | Vinciarelli | H02J 1/102 363/17 |
| 2003/0227280 A1 * | 12/2003 | Vinciarelli | H02J 1/102 323/265 |
| 2009/0185398 A1 * | 7/2009 | Cuk | H02M 1/34 363/21.1 |
| 2010/0237974 A1 * | 9/2010 | Yoon | H01F 17/0013 336/170 |
| 2013/0093257 A1 * | 4/2013 | Goto | H02J 50/10 307/104 |
| 2013/0254574 A1 * | 9/2013 | Zacchio | H04W 52/0229 713/323 |
| 2014/0306781 A1 * | 10/2014 | Zhang | H03H 7/09 333/177 |
| 2015/0097528 A1 * | 4/2015 | Biagini | H02M 1/4225 320/109 |
| 2016/0080181 A1 | 3/2016 | Yun et al. | |
| 2016/0307690 A1 * | 10/2016 | Madsen | H01F 27/2804 |
| 2018/0026589 A1 * | 1/2018 | Labanc | H03H 7/38 |
| 2018/0269833 A1 * | 9/2018 | Issakov | H03B 5/1243 |
| 2019/0043661 A1 * | 2/2019 | Jin | H01F 27/346 |

* cited by examiner

APPARATUS FOR COMMUNICATING ACROSS AN ISOLATION BARRIER

CROSS-REFERENCE TO RELATED APPLICATIONS

This application claims benefit of U.S. provisional patent application Ser. No. 62/561,450, titled "Isolation Barrier" and filed Sep. 21, 2017, which is herein incorporated in its entirety by reference.

BACKGROUND OF THE INVENTION

Field of the Invention

Embodiments of the present invention generally relate to isolation barriers and, more particularly, to an apparatus for transmitting data through an isolation barrier.

Description of the Related Art

Galvanic isolation barriers provide a safety barrier across which data may be transmitted between a low-voltage side of a circuit and a high-voltage side of a circuit. For example, some devices, such as power converters, may have switches on the high-voltage side of the device while the control electronics are on the low-voltage side of the device, requiring data to be communicated across an isolation barrier to drive the high-voltage switches.

Therefore, there is a need in the art for a more efficient and simpler method and apparatus for transmitting a signal through an isolation barrier.

SUMMARY

Embodiments of the present invention relate to an apparatus for generating a drive signal using inductive transmission across an isolation barrier substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to a low-cost isolated driver for generating a drive signal using inductive transmission across an isolation barrier. In one or more embodiments, the isolated driver comprises a transmitter coupled to a receiver via a differential inductive barrier structure with very low common mode impedance on each port. The isolated driver is configured such that any common mode current is circulated to a local ground. A low impedance path is present to the local ground rather than through the electronics.

In one or more embodiments, the transmitter comprise a differential oscillator that is on-off keying (OOK) modulated; a transformer providing the isolation barrier is part a resonant circuit that is part of the oscillator structure. By combining the oscillator and the isolator function, the resonance of the resonant circuit can be used to define the operating frequency. Additionally, the receiver may be incorporated as an integral part of the transmission system.

Generally, the isolated driver has a high dV/dt tolerance, for example on the order or 50 kV/microsecond, for tolerating very large voltage changes across the barrier over short time periods. The isolated driver also has a high voltage isolation (e.g., 6 kV reinforced isolation), low power consumption (e.g., <5 mA Tx per channel, <1 mA Rx per channel), low delay (e.g., 40 ns maximum to a switch gate), low differential delay between channels (e.g., 20 ns), robust transmission such that there are no persistent errors, low EMC (e.g., >10 dB below class B limit) and immunity, is easy to implement (e.g., no tuning and the like) and certify, small footprint, wide temperature range (e.g., −40° to +125° C.), and low cost (e.g., <$0.20 per channel).

Figure 1:
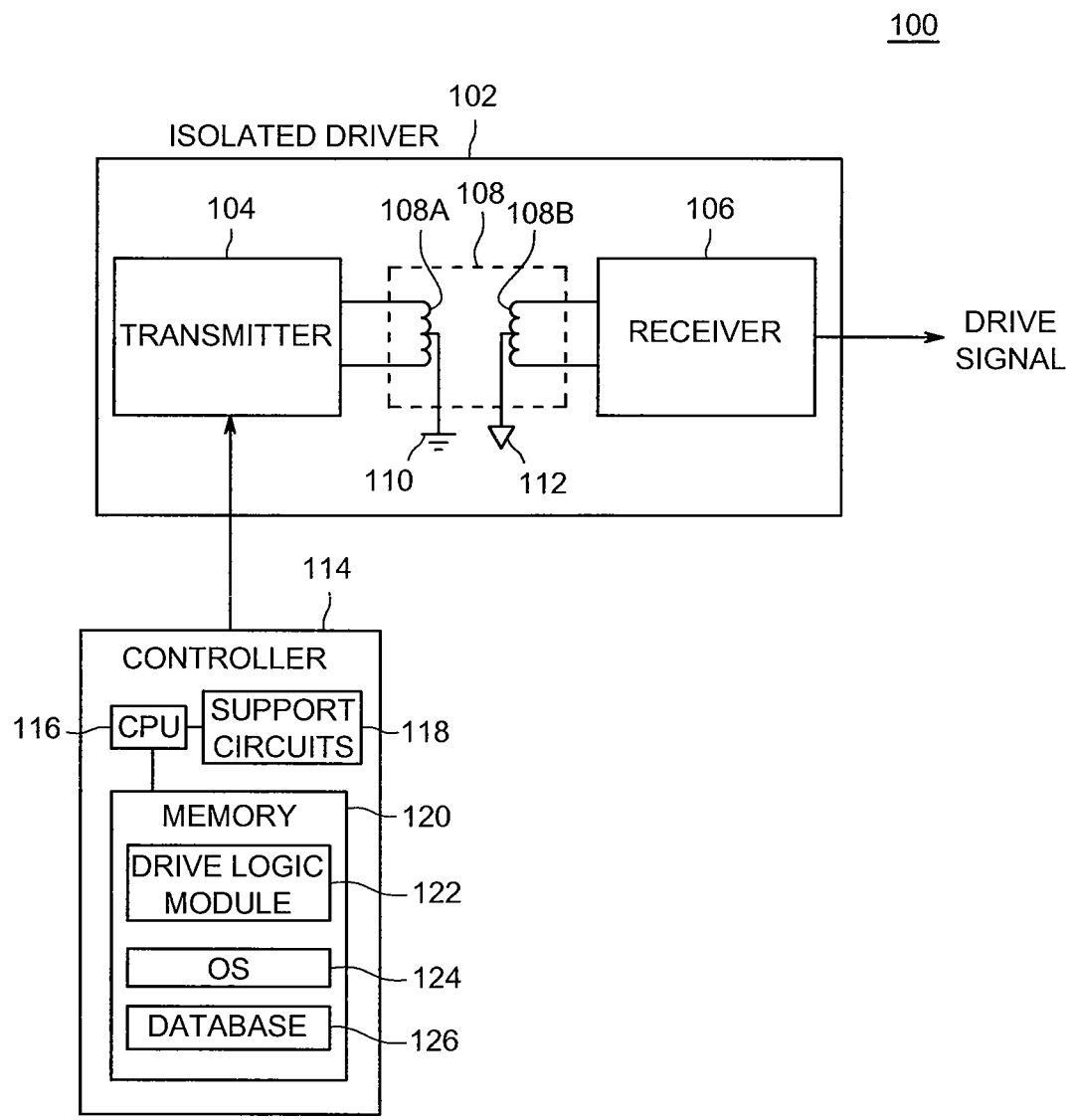
FIG. 1 is a functional block diagram of an apparatus for transmitting data through an isolation barrier in accordance with at least one embodiment of the invention.

FIG. 1 is a block diagram of an apparatus 100 for generating a drive signal via an isolated driver 102 in accordance with one or more embodiments of the present invention. The isolated driver 102 comprises a transmitter 104, an isolation barrier transformer 108, and a receiver 106. The isolation barrier transformer 108 provides galvanic isolation, for example between the low-voltage side of a circuit and switches used on the high-voltage side of the circuit. The isolation barrier transformer 108, which may also be referred to as transformer 108, has a very high isolation voltage, for example on the order of 6 kV AC, and a very high dV/dt tolerance, for example on the order of 50 kV/microsecond.

The transmitter 104 is coupled to a first winding 108A of the transformer 108. The first winding 108A has a center tap coupled to a local ground 110. A second winding 108B of the transformer 108 is coupled to the receiver 106, which generates an output drive signal. Analogous to the first winding 108A, the second winding 108B has a center tap coupled to a local ground 112. The transformer windings may have inductances on the order of 10 nH.

A controller 114 is coupled to the transmitter 104 to provide an input signal indicating the desired state for the drive signal output from the isolated driver 102; for example, the controller 114 may provide a binary signal for indicating the desired state. In one or more embodiments, such as the embodiments described herein, the drive signal is generated for driving a switch, although in other embodiments the drive signal may be generated for other uses.

The controller 114 comprises at least one central processing unit (CPU) 116 coupled to each of a memory 120 and support circuits 118 (i.e., well known circuits used to promote functionality of the CPU 116, such as a cache, power supplies, clock circuits, buses, input/output (I/O) circuits, and the like). The CPU 116 may comprise one or more conventionally available microprocessors or microcontrollers. The controller 114 may be implemented using a general purpose computer that, when executing particular software, becomes a specific purpose computer for performing various embodiments of the present invention. In one or more embodiments, the CPU 116 may be a microcontroller comprising internal memory for storing controller firmware that, when executed, provides the controller functionality described herein. In some embodiments, the controller 114 may additionally or alternatively comprise one or more application specific integrated circuits (ASICs) for performing one or more of the functions described herein.

The memory 120 may comprise random access memory, read only memory, removable disk memory, flash memory, and various combinations of these types of memory; the memory 120 is sometimes referred to as main memory and may, in part, be used as cache memory or buffer memory. The memory 120 generally stores an operating system (OS) 124, such as one of a number of available operating systems for microcontrollers and/or microprocessors (e.g., LINUX, Real-Time Operating System (RTOS), and the like). The memory 120 further stores non-transient processor-executable instructions and/or data that may be executed by and/or used by the CPU 116. These processor-executable instructions may comprise firmware, software, and the like, or some combination thereof.

The memory 120 stores various forms of application software, such as a drive logic module 122 for determining an output signal from the controller 114 to achieve a desired drive signal from the receiver 106. The memory 120 additionally stores a database 126 for storing data, for example data related to the present invention. In various embodiments, the drive logic module 122 and the database 126, or portions thereof, may be implemented in software, firmware, hardware, or a combination thereof.

Generally the transmitter 104 uses a state-based technique, such as on-off keying (OOK), rather than a transition-based technique for transmission, although in some alternative embodiments other types of state-based techniques or a transition-based technique may be used. In order to provide a low detection time at the receiver 106, an ultra-high frequency (UHF) carrier is employed; for example, for a response time on the order of 20 ns, a carrier having a frequency of at least 1 GHz is used.

In some embodiments, the isolated driver 102 may be used for driving switches in a power converter, such as a DC-AC converter. In other embodiments, the isolated driver 102 may be used in other types of power electronics.

Figure 2:
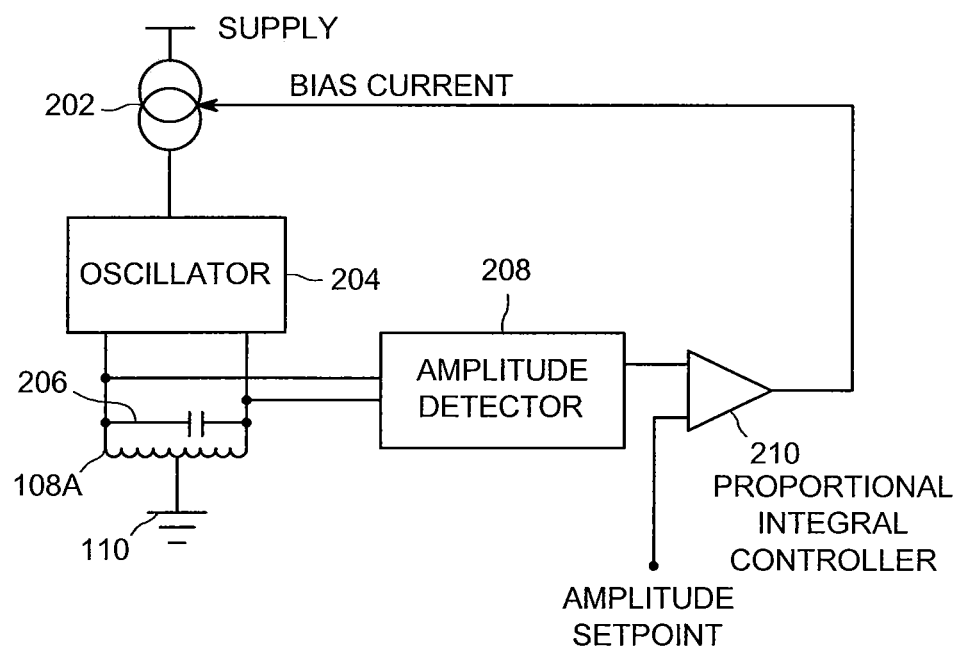
FIG. 2 is a block diagram of a transmitter in accordance with at least one embodiment of the invention.
Figure 2:
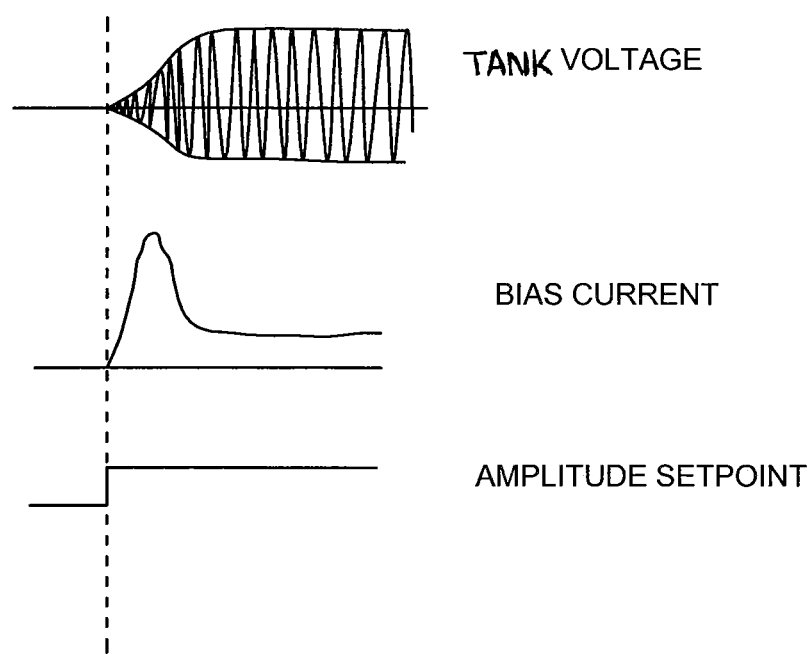

FIG. 2 is a block diagram of a transmitter 104 in accordance with one or more embodiments of the present invention. The transmitter 104 comprises a current control 202 coupled to the input of an oscillator 204. The oscillator 204 is coupled across a capacitor 206 and the first winding 108A, which has a center tap coupled to the local ground 110. The input of an amplitude detector 208 is coupled across the oscillator 204, and the output of the amplitude detector 208 is coupled to a first input of a proportional integral (PI) controller 210. A second input of the PI controller 210 is coupled to a signal indicating the amplitude set point for the carrier amplitude at the given time; the output of the PI controller 210 provides a bias current back to the current control 202.

The first winding 108A is a mid-grounded single turn inductor to absorb common mode current. Rather than imposing a fixed signal at an arbitrary frequency onto the transformer winding 108, the capacitor 206 and the first winding 108A form a resonant tank which results in the oscillator 204 being self-driven from the transformer 108, thus using the inductance of the transformer 108 to determine the frequency of the system. By using the inductance of the first winding 108A to determine the frequency of the system, the transmitter 104 will be guaranteed to operate at the natural transmission frequency for that isolation barrier. In some other embodiments, the capacitor 206 may be a parasitic capacitance rather than a discrete component, one or more other capacitors may be employed, and/or other parasitics may be used to resonate the circuit. In certain embodiments, the transmitter 104 may use a differential Colpitts-type structure for an oscillator.

In order to achieve proper start-up time, the carrier envelope must be suitably controlled, for example by controlling the differential pair current to achieve the right amplitude. In one or more embodiments, the gain of the differential pair is modulated by changing the bias current in it to increase the gain at start-up. In some embodiments, amplitude may be detected by a Gilbert Cell structure (e.g., as in the receiver 106). One example of a tank voltage along with the corresponding bias current and amplitude set point is depicted.

In order to achieve rapid turn-on and turn-off times for the oscillator 204, and thus minimize propagation delays, a low Q factor of the resonant tank is critical (e.g., less than 100, for example on the order of 20 or below). Additionally, a low Q factor results in a very noisy oscillator, which will result in broadening the spectrum of emission/lowering the density of the radiated energy; one or more other techniques may also be used for increasing the noisiness of the oscillator, such as using noisy transistors or adding a spoiler on the bias system. In some embodiments, the resonant tank may be tailored (for example, with added resistors or the like) to be a poor-quality resonant tank in order to achieve a low Q factor. In one or more embodiments, the oscillator Q factor may be below 20 in order to reduce spectral density and improve EMC.

In one or more embodiments, a dual-channel integrated circuit (IC) (3 pin Tank A, 3 pin Tank B, Vcc, Gnd, InA, InB) may be used. In certain embodiments, a TSSOP10 (i.e., a thin shrink small outline package) may be used. Semiconductor processes such as 65 nm-250 nm are suitable for this circuit.

Figure 3:
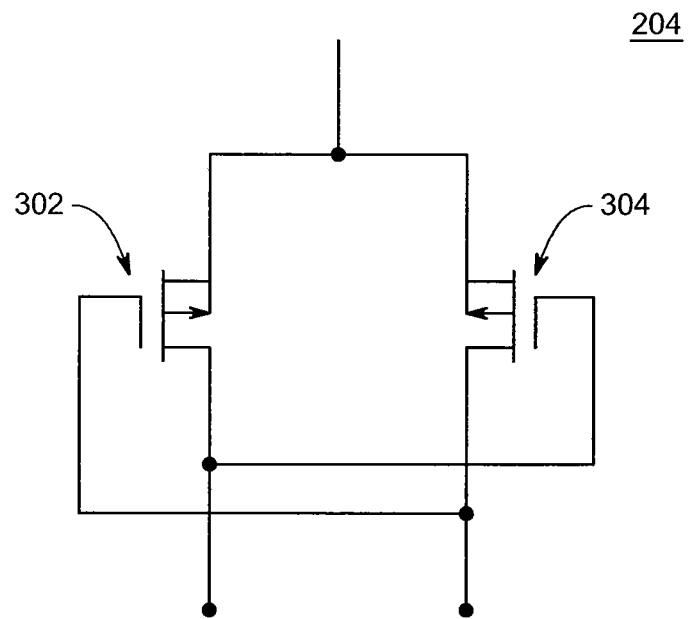
FIG. 3 depicts one example of a suitable oscillator active circuit in accordance with at least one embodiment of the invention.

FIG. 3 depicts one example of a suitable oscillator active circuit 204 in accordance with one or more embodiments of the present invention. The oscillator 204 comprises MOSFETs 302 and 304 coupled to one another by their source terminals at the input of the oscillator 204 and having their drain terminals as outputs from the oscillator 204. The gate terminal of the transistor 302 is coupled to the drain terminal of the transistor 304, and the gate terminal of the transistor 304 is coupled to the drain terminal of the transistor 302.

Figure 4:
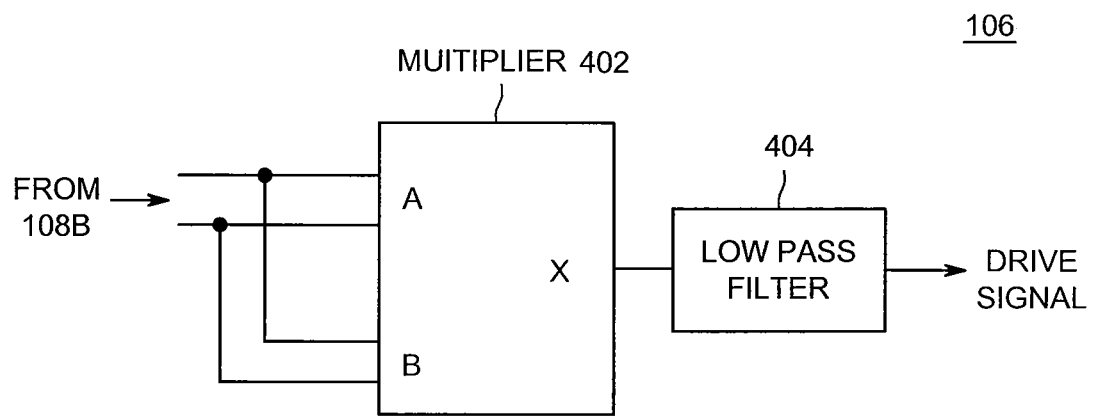
FIG. 4 is a block diagram of a receiver in accordance with at least one embodiment of the invention.

FIG. 4 is a block diagram of a receiver 106 in accordance with one or more embodiments of the present invention. The receiver 106 comprises a multiplier 402 having inputs A and B, both of the inputs A and B coupled across the winding 108B. The output of the multiplier 402 is coupled to a low-pass filter 404.

The receiver 106 demodulates the received signal using the squaring function of the multiplier 402, which may be implemented with a Gilbert cell in some embodiments. The resulting signal is then low-pass filtered via the low-pass filter 404, although in other embodiments the signal may be integrated over, for example, a few nanoseconds, and a decision (e.g., ON/OFF) is made. The receiver 106 may then be followed by a traditional switch driver, such as a MOSFET driver (e.g., technology like between 0.13 u and 0.35 u, 16V+ process). In some other embodiments, an external MOSFET driver may be used to eliminate the need for a high voltage process.

In some alternative embodiments the receiver 106 may be a simple amplitude detector comprising a diode bridge or the like.

In order to provide a status indication of the receiver 106 back to the transmitter 104, the receiver may be incorporated into the oscillation process. For example, the receiver 106 may be arranged such that it only creates a negative input resistance back to the receiver 106 only when it is powered for operation (i.e., when there is bias current through the receiver 106), which assists the oscillation. By making the oscillation in the transmitter 104 dependent on the receiver 106, on the transmitter side it can be detected when oscillation does not happen or takes much longer to happen as a result of the receiver 106 not being powered.

Figure 5:
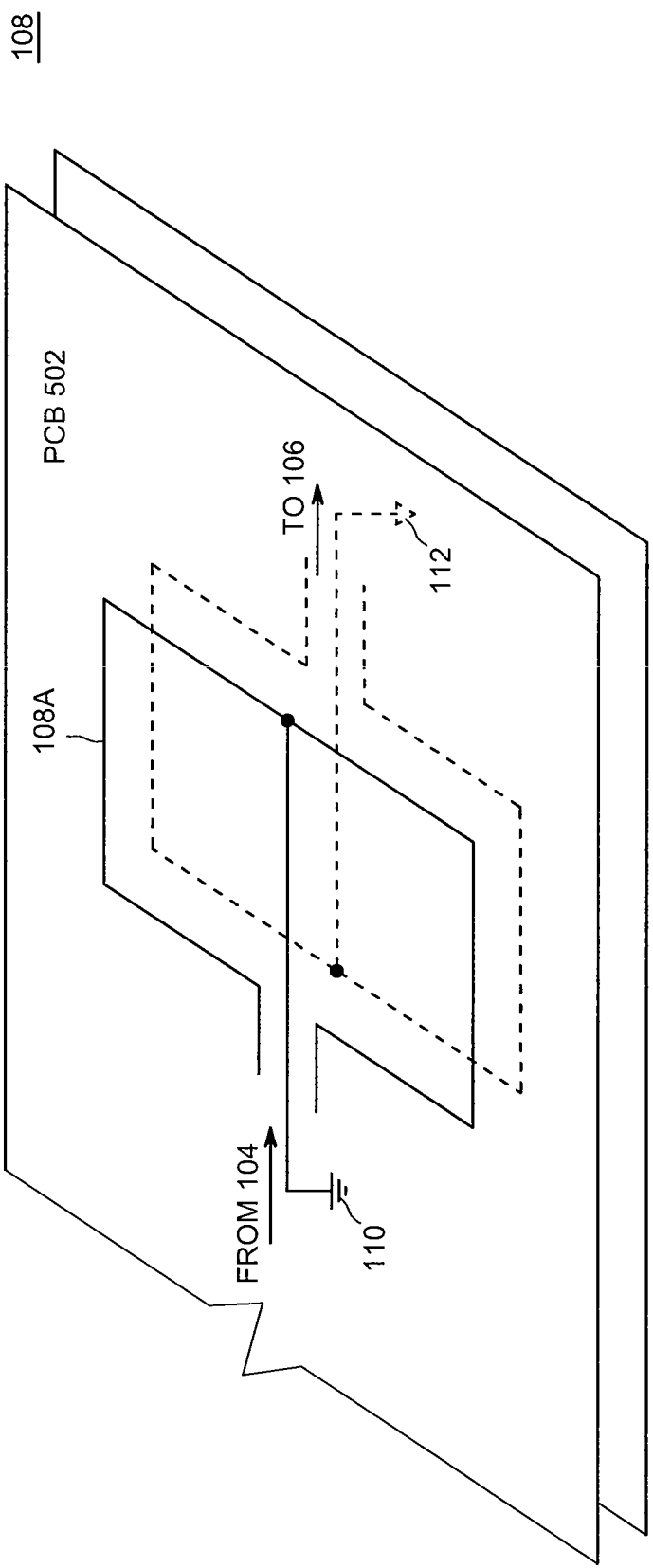
FIG. 5 depicts an isolation barrier transformer in accordance with at least one embodiment of the invention.

FIG. 5 is a depiction of an isolation barrier transformer 108 in accordance with one or more embodiments of the present invention. The windings 108A and 108B are each single-loop windings that are disposed on opposite sides of a printed circuit board (PCB) 502 for providing isolation. In some embodiments, the transformer 108 may be a 4×4 mm square (or round) loop transformer, although in some embodiments smaller dimensions may be used. The mutual inductance is low and highly dependent on the separation; the PCB 502 has a suitable thickness to achieve the proper isolation.

Figure 6:
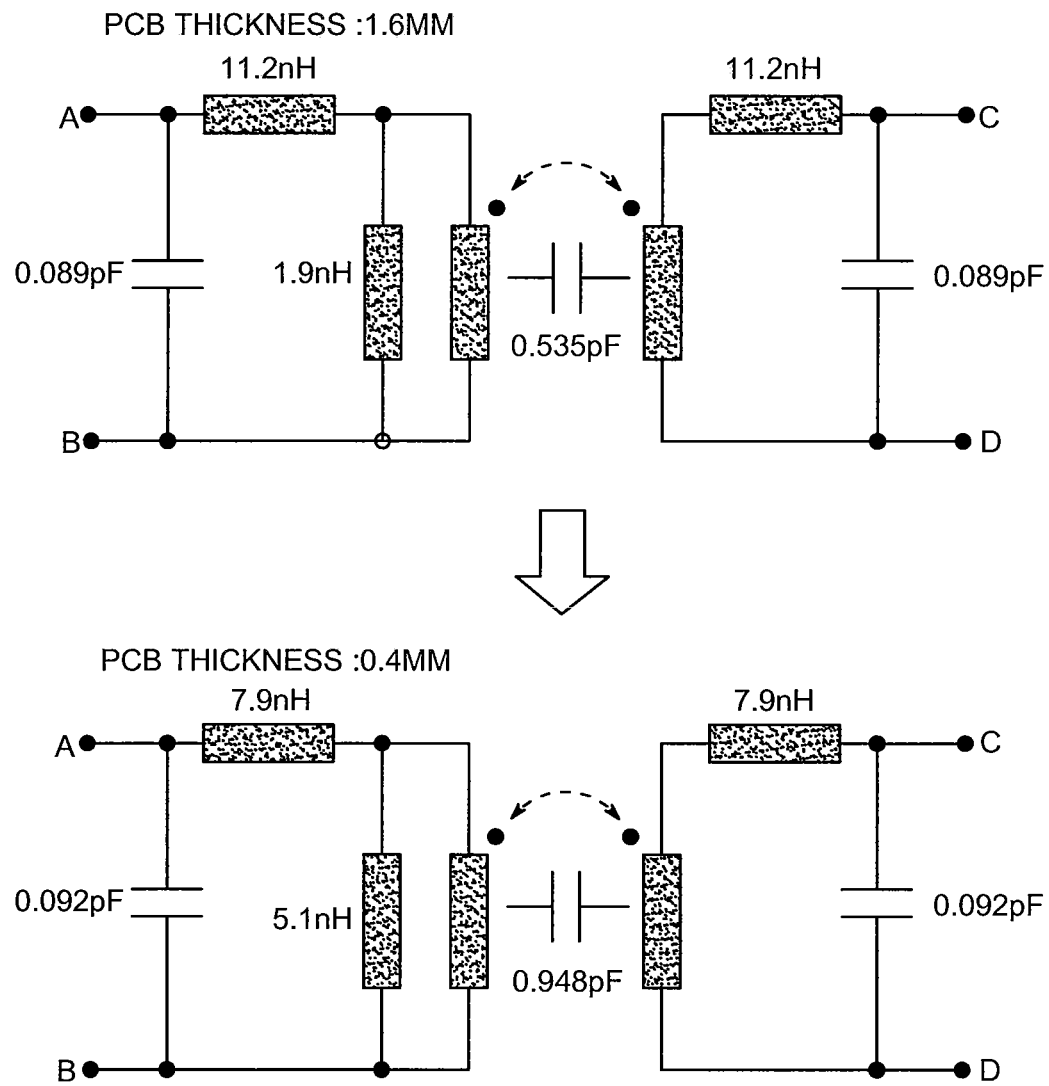
FIG. 6 depicts an example illustrating a change in capacitance resulting from a change in PCB thickness in accordance with one or more embodiments of the present invention.

Inter-winding parasitic capacitance is managed by the center taps of each of the windings 108A and 108B being coupled to respective local grounds 110 and 112. As a result of the center taps, common mode current generated by rapid voltage changes across the barrier is circulated back to the local ground. Such a topology provides a means to locally absorb the common mode current without impairing either the transmitter 104 or the receiver 106. Additionally, PCB thickness may be adjusted to reduce capacitance. FIG. 6 depicts an example illustrating the change in capacitance resulting from a change in PCB thickness.

Figure 7:
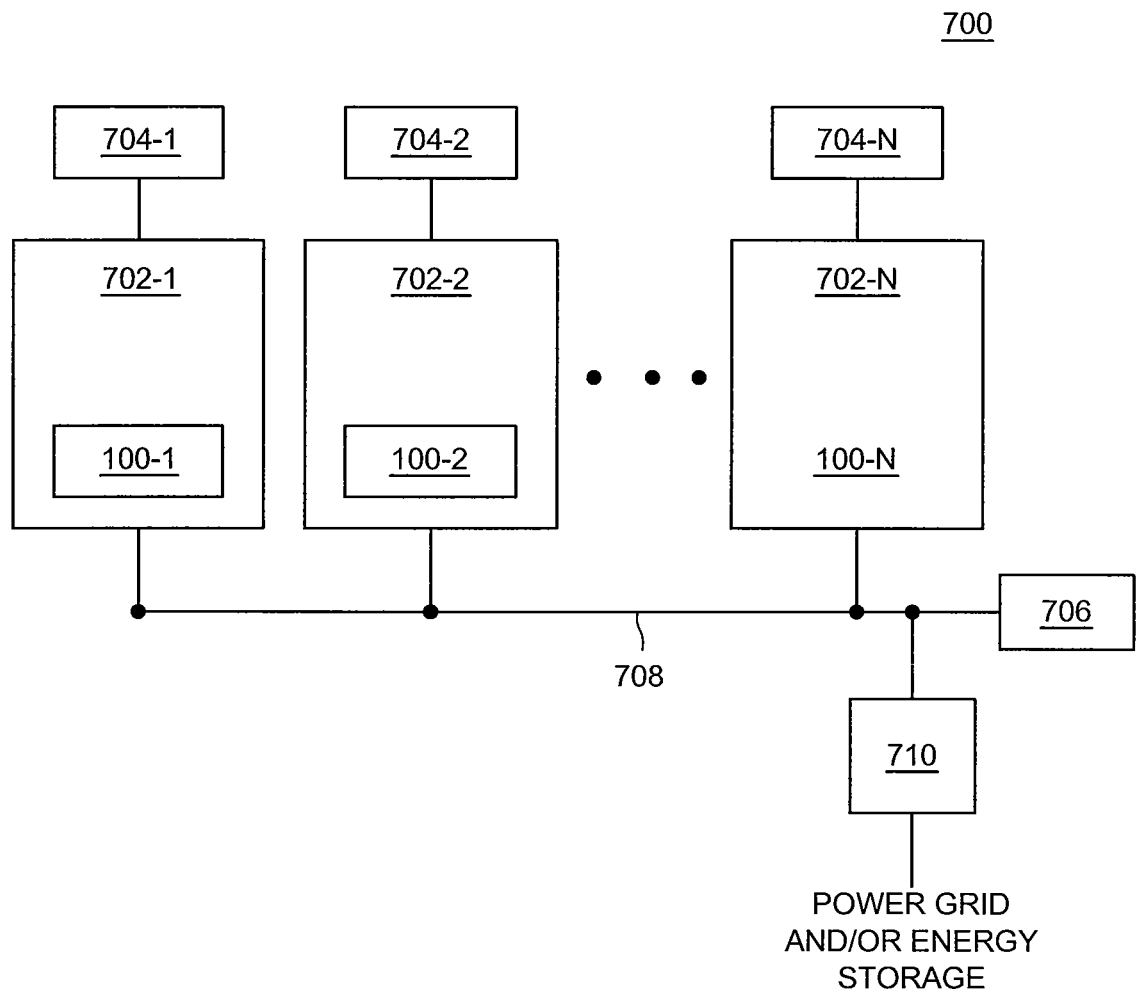
FIG. 7 is a block diagram of a system for power conversion using one or more embodiments of the present invention.

FIG. 7 is a block diagram of a system 700 for power conversion using power converters employing inductive transmission across an isolation barrier in accordance with one or more embodiments of the present invention. This diagram only portrays one variation of the myriad of possible system configurations and devices that may utilize the present invention. The present invention can be utilized in a variety of systems or devices that require transmitting a signal through an isolation barrier.

The system 700 comprises a plurality of power converters 702-1, 702-2 . . . 702-N, collectively referred to as power converters 702; a plurality of power sources 704-1, 704-2 . . . 704-N, collectively referred to as power sources 704; a controller 706; a bus 708; and a load center 710. The power sources 704 may be any suitable DC source, such as an output from a previous power conversion stage, a battery, a renewable energy source (e.g., a solar panel or photovoltaic (PV) module, a wind turbine, a hydroelectric system, or similar renewable energy source), or the like, for providing DC power. In some embodiments, the power converters 702 may be bidirectional converters and one or more of the power sources 704 is an energy storage/delivery device that stores energy generated by the corresponding power converter 702 and couples stored energy to the corresponding power converter 702.

Each power converter 702-1, 702-2 . . . 702-N is coupled to a power source 704-1, 704-2 . . . 704-N, respectively, in a one-to-one correspondence; in some alternative embodiments, multiple power sources 704 may be coupled to a single power converter 702. The power converters 702 are coupled to the controller 706 via the bus 708.

The controller 706 is capable of communicating with the power converters 702 by wireless and/or wired communication (e.g., power line communication) for providing operative control of the power converters 702. In some embodiments, the controller 706 may be a gateway that receives data (e.g., performance data) from the power converters 702 and communicates the data and/or other information to a remote device or system, such as a master controller (not shown). Additionally or alternatively, the gateway may receive information from a remote device or system (not shown) and may communicate the information to the power converters 702 and/or use the information to generate control commands that are issued to the power converters 702. The power converters 702 are further coupled to the load center 710 via the bus 708.

The power converters 702 convert the DC power from the DC power sources 704 to an AC output power and couple the generated output power to the load center 710 via the bus 708. The generated power may then be distributed for use, for example to one or more appliances, and/or the generated energy may be stored for later use, for example using batteries, heated water, hydro pumping, $H_2O$-to-hydrogen conversion, or the like. In some embodiments, the power converters 702 convert the DC input power to AC power that is commercial power grid compliant and couple the AC power to the commercial power grid via the load center 710. In some other embodiments, the power converters 702 may be AC:AC converters that receive an AC input; in still other embodiments, the power converters 702 may be AC:DC or DC:DC converters and the output power is a DC output power and the bus 708 is a DC bus.

Each of the power converters 702 comprises the apparatus 100 for generating a drive signal for driving one or more switches of the power converter 702 (i.e., the power converters 702-1, 702-2 . . . 702-N comprise the apparatuses 100-1, 100-2 . . . 100-N, respectively) utilized in the conversion of the input power to the output power. The power converters 702 are any type of suitable power converters, such as flyback converters, resonant converters and the like.

While the foregoing is directed to embodiments of the present invention, other and further embodiments of the invention may be devised without departing from the basic scope thereof, and the scope thereof is determined by the claims that follow.

The invention claimed is:

1. Apparatus for communicating across an isolation barrier, comprising:
   a transformer having a first winding disposed on a first side of a printed circuit board (PCB), the first winding having a center tap coupled to a first local ground, and a second winding disposed on a second side of the PCB, the second side opposite to the first side, the second winding having a center tap coupled to a second local ground;

a transmitter coupled to the first winding and including an oscillator that facilitates controlling a bias current used to increase gain during operation; and a receiver, coupled to the second winding, that generates an output signal based on a signal received from the transmitter.

2. The apparatus of claim 1, wherein the receiver provides a status indication, the status indication indicating whether the receiver is operating, back to the transmitter.

3. The apparatus of claim 2, wherein the receiver provides the status indication by creating a negative input resistance only when it is powered for operation.

4. The apparatus of claim 1, wherein the oscillator is coupled to a resonant tank, and wherein the resonant tank comprises the first winding such that the oscillator is self-driven from the transformer.

5. The apparatus of claim 4, wherein the transmitter uses a state-based technique.

6. The apparatus of claim 5, wherein the oscillator has a Q factor below 20.

7. The apparatus of claim 1, further comprising a controller, coupled to the transmitter, that provides an input signal to the transmitter indicating a desired state for the output signal from the receiver.

8. The apparatus of claim 1, wherein the first winding and the second winding are each single-loop windings.

9. The apparatus of claim 1, wherein the transformer has an isolation voltage of 6 kV AC and a dV/dt tolerance of 50 kV/microsecond.

10. A power conversion apparatus employing inductive transmission across an isolation barrier, comprising:

a power converter comprising:

a transformer having a first winding disposed on a first side of a printed circuit board (PCB), the first winding having a center tap coupled to a first local ground, and a second winding disposed on a second side of the PCB, the second side opposite to the first side, the first winding having a center tap coupled to a second local ground;

a transmitter coupled to the first winding and including an oscillator that facilitates controlling a bias current used to increase power gain during operation; and a receiver, coupled to the second winding, that generates an output signal, the output signal based on a signal received from the transmitter, that drives at least one switch of the power converter.

11. The power conversion apparatus of claim 10, wherein the receiver provides a status indication, the status indication indicating whether the receiver is operating, back to the transmitter.

12. The power conversion apparatus of claim 11, wherein the receiver provides the status indication by creating a negative input resistance only when it is powered for operation.

13. The power conversion apparatus of claim 10, wherein the oscillator is coupled to a resonant tank, and wherein the resonant tank comprises the first winding such that the oscillator is self-driven from the transformer.

14. The power conversion apparatus of claim 13, wherein the transmitter uses a state-based technique.

15. The power conversion apparatus of claim 14, wherein the oscillator has a Q factor below 20.

16. The power conversion apparatus of claim 10, further comprising a controller, coupled to the transmitter, that provides an input signal to the transmitter indicating a desired state for the output signal from the receiver.

17. The power conversion apparatus of claim 10, wherein the first winding and the second winding are each single-loop windings.

18. The power conversion apparatus of claim 10, wherein the transformer has an isolation voltage of 6 kV AC and a dV/dt tolerance of 50 kV/microsecond.

* * * * *